(12) United States Patent
Zhou et al.

(10) Patent No.: US 9,391,300 B2
(45) Date of Patent: Jul. 12, 2016

(54) METHOD OF PRODUCING A TRANSPARENT DIFFUSIVE OLED SUBSTRATE

(71) Applicant: SAINT-GOBAIN GLASS FRANCE, Courbevoie (FR)

(72) Inventors: Yechun Zhou, Shanghai (CN); Young Seong Lee, Seoul (KR); Jean Philippe Schweitzer, Chamant (FR); Vincent Sauvinet, Grenoble (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 14/431,444

(22) PCT Filed: Sep. 24, 2013

(86) PCT No.: PCT/EP2013/069869
§ 371 (c)(1),
(2) Date: Mar. 26, 2015

(87) PCT Pub. No.: WO2014/048927
PCT Pub. Date: Apr. 3, 2014

(65) Prior Publication Data
US 2015/0255753 A1 Sep. 10, 2015

(30) Foreign Application Priority Data

Sep. 28, 2012 (EP) .................................... 12306179

(51) Int. Cl.
| H01L 21/00 | (2006.01) |
| H01L 51/52 | (2006.01) |
| C03C 17/04 | (2006.01) |
| C03C 8/04 | (2006.01) |
| C03C 17/34 | (2006.01) |
| C03C 19/00 | (2006.01) |
| H01L 51/00 | (2006.01) |

(52) U.S. Cl.
CPC .............. *H01L 51/5268* (2013.01); *C03C 8/04* (2013.01); *C03C 17/04* (2013.01); *C03C 17/3417* (2013.01); *C03C 19/00* (2013.01); *H01L 51/0096* (2013.01); *H01L 51/5206* (2013.01); *C03C 2217/948* (2013.01); *C03C 2218/17* (2013.01); *C03C 2218/31* (2013.01); *Y10T 428/24372* (2015.01)

(58) Field of Classification Search
None
See application file for complete search history.

(56) References Cited

U.S. PATENT DOCUMENTS

| 2003/0054579 A1* | 3/2003 | Pakbaz | H01L 27/32 438/22 |
| 2011/0126890 A1* | 6/2011 | Borrelli | H01L 31/0236 136/255 |
| 2012/0313134 A1* | 12/2012 | Vermersch | C03C 8/04 257/99 |

FOREIGN PATENT DOCUMENTS

| EP | 1 932 813 A1 | 6/2008 | |
| FR | WO 2011089343 A1 * | 7/2011 | ................ C03C 8/04 |
| WO | WO 2009/146760 A1 | 12/2009 | |
| WO | WO 2011/089343 A1 | 7/2011 | |

OTHER PUBLICATIONS

International Search Report as issued in International Patent Application No. PCT/EP2013/069869, dated Dec. 20, 2013.
Written Opinion of the International Searching Authority as issued in International Patent Application No. PCT/EP2013/069869, dated Dec. 20, 2013.

* cited by examiner

*Primary Examiner* — Robert Vetere
(74) *Attorney, Agent, or Firm* — Pillsbury Winthrop Shaw Pittman LLP

(57) ABSTRACT

A method of producing a transparent diffusive OLED substrate includes lapping one face or both faces of a flat translucent glass substrate with an abrasive slurry, so as to obtain a flat glass substrate with at least one roughened surface having a roughness profile with an arithmetical mean deviation $R_a$ of between 0.1 μm and 2.0 μm; coating the roughened surface or one of the roughened surfaces with a high index glass frit having a refractive index of at least 1.7, the amount of the high index glass frit being sufficient to completely cover the roughness profile of the roughened surface after melting of the frit, and heating the coated substrate to a temperature above the melting temperature of the high index glass frit and below the softening temperature of the underlying substrate, so as to form high index enamel on one of the roughened surfaces.

27 Claims, No Drawings

METHOD OF PRODUCING A TRANSPARENT DIFFUSIVE OLED SUBSTRATE

CROSS-REFERENCE TO RELATED APPLICATIONS

This application is the U.S. National Stage of PCT/EP2013/069869, filed Sep. 24, 2013, which in turn claims priority to European Application No. 12306179.8, filed Sep. 28, 2012. The contents of all of these applications are incorporated herein by reference in their entirety.

The present invention is drawn to a new method for producing translucent, light-scattering substrates for organic light emitting diodes (OLED) and to substrates obtainable by such a method.

OLEDs are opto-electronic elements comprising a stack of organic layers with fluorescent or phosphorescent dyes sandwiched between two electrodes, at least one of which is translucent. When a voltage is applied to the electrodes the electrons injected from the cathode and the holes injected from the anode recombine within the organic layers, resulting in light emission from the fluorescent/phosphorescent layers.

It is commonly known that light extraction from conventional OLEDs is rather poor, most of the light being trapped by total internal reflection in the high index organic layers and transparent conductive layers (TCL). Total internal reflection takes place not only at the boundary between the high index TCL and the underlying glass substrate (refractive index of about 1.5) but also at the boundary between the glass and the air.

According to estimates, in conventional OLEDs not comprising any additional extraction layer about 60% of the light emitted from the organic layers is trapped at the TCL/glass boundary, an additional 20% fraction is trapped at the glass/air surface and only about 20% exit the OLED into air.

It is known to reduce this problem by means of a light scattering layer between the TCL and the glass substrate. Such light scattering layers have a high refractive index close to the TCL index and contain a plurality of light diffusing elements.

It is also known to increase out-coupling of light by texturing the interface between the glass and the high index layers of the OLED.

Both of these "internal" extraction means, also commonly called "internal extraction layers" (IEL), comprise asperities that need to be planarized before applying the TCL or the organic stack.

It is further known to reduce light trapping at the glass/air interface by means of an "external extraction layer" (EEL) consisting for example of a textured plastic film optically coupled to the outer surface of the glass substrate.

WO2011/089343 discloses OLED substrates comprising at least one textured surface planarized with a high index glass coating. The substrates are described as being texturized by acid etching. Glass etching using strong acids, in particular HF, is a commonly used method for texturizing glass surfaces. Such a wet chemistry method however is a complicated process when carried out on thin glass (thickness<1 mm). This technique allows only for one of the two faces to be etched per process step as the glass plate has to be kept in a horizontal position during the etching step. Furthermore the roughness profile parameters are difficult to optimize and above all the use of HF results in important security problems for the environment and persons working nearby.

The idea underlying the present invention is to replace the chemical roughening step by a much less hazardous mechanical roughening step allowing for better control of the roughness profile and making it possible to simultaneously roughen both sides of the substrates, thereby producing in a single step the internal and external extraction layers (IEL and EEL) of a transparent OLED glass substrate.

The lapping step, implemented as the first step of the method of the present invention, is easily carried out on rather thin glass substrates having thicknesses lower than 2 mm, and even lower than 1 mm. The process parameters such as the hardness and particle size of the abrasive, lapping pressure, speed and time, allows for easy adjustment and control of the roughness profile.

When comparing the roughened substrates obtained by chemical etching and mechanical roughening, Applicants have further observed that for a given desirable haze range of about 85 to 95%, the roughness profile of mechanically abraded glass surfaces can be easily tuned by adjusting slurry mesh (particles size distribution of the slurry) and consequently can be significantly less profound than for acid-etched surfaces. This means that a much thinner high index glass coating will be sufficient to satisfactorily fill up and planarize the asperities of the light-scattering profile, thereby leading both to lower cost of production and a thinner final product.

It is commonly known to use lapping followed by polishing for thinning and flattening glass substrates for display panels, in particular for liquid crystal display (LCD) panels. In such applications, low haze and low roughness profiles are sought. In the polishing step, planarization of the rough surfaces is obtained by using extremely fine and uniform abrasives. The polished surface is conventionally known as "mirror surface".

In the present invention the flattening process is interrupted before the fine polishing step. The glass substrates are submitted to a one-side or two-side lapping step. After reaching a suitable surface roughness (Ra), one side is then planarized not by polishing with fine abrasives as in the prior art, but by filling up and covering the resulting roughened profile by means of a high refractive index glass frit and subsequent melting to form a uniform planar glass enamel devoid of any protruding glass peaks. The side carrying the high index enamel forms the internal extraction layer (IEL) and will later receive the transparent conducting layer (anode). In case the lapping step is carried out on both sides, the second non-planarized surface will act as an external extraction layer (EEL).

The method of the present invention is very interesting because it is suitable for rather low grade glass such as float glass having surface defects (top tin, top speck . . . ), surface cracks or scratches, surface chemical modification due to glass weathering or aging after storage at high temperature and high humidity for a long period of time. These superficial defects will be eliminated during the lapping step. Moreover bulk defects, such as bubbles, will become invisible because of the hazy surface provided by the lapping process. The use of low grade glass allows for a further reduction of the cost of production.

The present invention thus provides a safe and rather simple process for producing a thin, low-cost light-scattering substrate for OLEDs. The three elemental steps of the process (lapping of a flat glass substrate—coating of a glass frit—melting of the glass frit coating) are all well known in the prior art and may be implemented with existing or known technical equipment. However, to the applicants' best knowledge, up to now these steps have not been combined in the way described and claimed hereafter to produce substrates for OLEDs.

The method for producing transparent diffusive OLED substrates of the present invention comprises the following successive steps:

(a) lapping one face or both faces of a flat translucent glass substrate with an abrasive slurry, so as to obtain a flat glass substrate with at least one roughened surface having a roughness profile with an arithmetical mean deviation $R_a$ of between 0.1 µm and 2.0 µm, preferably between 0.15 µm and 1.5 µm, more preferably between 0.2 and less than 1.0 µm and most preferably of between 0.25 µm and 0.8 µm, (b) coating the roughened surface or one of the roughened surfaces with a high index glass frit having a refractive index of at least 1.7, preferably of between 1.7 and 2.2, the amount of the high index glass frit being sufficient to completely cover the roughness profile of the roughened surface after melting of said frit;

(c) heating the coated substrate to a temperature above the melting temperature of the high index glass frit and below the softening temperature of the underlying substrate, so as to form high index enamel on one of the roughened surfaces.

The lapping slurry may be any of known slurries containing ceramic abrasive particles having a high enough hardness and a suitable particle size.

The Knoop hardness of the abrasive particles preferably is at least 1800 HK, preferably at least 2000 HK. The abrasive particles are selected for example from the group consisting of aluminium oxide (including white corundum), silicon carbide, in particular black and green SiC, zirconium oxide doped for example with Mg, Y or Ce, boron nitride, and mixtures of these particles and composite core-shell particles, such as SiC-coated alumina.

White corundum particles (2160 HK) and green SiC particles (2600 HK) are most preferred.

The average particle size of the abrasive is preferably comprised in the range from 500 to 5000 mesh, more preferably from 800 to 3500 mesh, even more preferably from 1000 to 3200 mesh and most preferably from 2000 to 3000 mesh.

Abrasive slurries with finer particles (average particle size>5000 mesh) will result in insufficiently rough surfaces and excessively long lapping times. When using excessively coarse particles (<500 mesh) the processed glass surface will be too rough, requiring undesirably high amounts of glass frit for planarization.

Suitable abrasive slurries are available and are sold for example by G&P Technology Company.

As explained earlier, the lapping step (a) preferably is performed simultaneously on both faces of the flat glass substrate, resulting in an identical roughness profile on both sides. One could of course contemplate lapping both sides separately under distinct lapping conditions but there is generally no specific advantage in doing so.

The arithmetical mean deviation $R_a$ is defined in ISO 4287. It may be measured by scanning electron microscopy (SEM) of cross sections of the sample, by surface profile measurement or by 3D laser microscopy. In the present invention most of the experimental results have been obtained by confocal laser scanning microscopy (Keyence VK-X100 microscope, with a laser spot size of 0.26 µm×0.26 µm, analysis on an area of 270 µm×202 µm). The mean width of the profile elements $RS_m$, such as defined in ISO 4287, may be measured with the same equipment but will be extracted from a line scan.

The flat translucent glass substrates entering step (a) generally have a thickness of between 0.1 and 5 mm, preferably of between 0.3 and 1.6 mm.

They are preferably edge-grinded beforehand because ungrinded glass edges may release glass chips that are much larger than the abrasive particles and can lead to unsightly scratches on the glass surface.

The lapping step (a) may be carried out on known laboratory or industrial lapping machines such as LCD industry polishing equipment or cheaper equipment dedicated to optical applications requiring simultaneous double face polishing like SpeedFam 22B machine (from SpeedFam Inc., Taiwan)

The lapping pressure is preferably comprised between 1.38 kPa and 6.89 kPa (0.2-1.0 psi), preferably between 2.1 and 5.5 kPa (0.3-0.8 psi) and is maintained for a duration (lapping time) comprised between 3 and 60 minutes, preferably between 5 and 30 minutes more preferably between 10 and 20 minutes. It is generally not necessary to implement two or more successive lapping steps starting with rather coarse abrasives and finishing with finer abrasives. In a preferred embodiment, the method of the present invention comprises only one lapping step using a single type of abrasive slurry.

The flat glass substrate resulting from step (a)—having either one or both of its surfaces roughened—generally has a haze comprised between 75 and 98%, preferably between 85 and 97%, and more preferably between 87 and 95%. Haze value can be measured by optical spectrophotometers like PE Lambda 950 or Varian Carry 5000, but also by faster and cheaper dedicated device like BYK Hazemeter.

In the following step, a thin layer of a high index glass frit is coated onto the rough face or on one of the rough faces of the substrate. Such a coating is preferably applied by screen printing, spray coating, bar coating, roll coating, slot coating and possibly spin coating, of an aqueous or organic suspension of glass particles. A description of suitable high index glass frits and methods for coating and firing them can be found for example in EP 2 178 343.

The glass frit should be selected to have a melting point comprised between 450° C. and 570° C. and should lead to an enamel having a refractive index of 1.7 to 2.2.

Preferred glass frits have the following composition:

$Bi_2O_3$: 55-75 wt %
BaO: 0-20 wt %
ZnO: 0-20 wt %
$Al_2O_3$: 1-7 wt %
$SiO_2$: 5-15 wt %
$B_2O_3$: 5-20 wt %
$Na_2O$: 0.1-1 wt %
$CeO_2$: 0-0.1 wt %

In a typical embodiment, the glass frit particles (70-80 wt %) are mixed with 20-30 wt % of an organic vehicle (ethyl cellulose and organic solvent). The resulting frit paste is then applied onto the textured glass substrate by screen printing or slot coating. The resulting layer is dried by heating at a temperature of 120-200° C. The organic binder (ethyl cellulose) is burned out at a temperature of between 350-440° C., and the firing step resulting in the final enamel is carried out at a temperature of 450° C. to 570° C.

The resulting enamels have been shown to have a surface roughness with an arithmetical mean deviation $R_a$ (ISO 4287) of less than 0.5 nm when measured by AFM on an area of 10 µm×10 µm. One of the advantages of the present invention is the rather shallow roughness profile of the lapped surfaces. As the lapped surfaces can have a lower mean height of profile elements (ISO 4287:1997, 4.1.4) than acid-etched substrates, the minimum amount for completely covering the texture can be decreased.

In the present invention the amount of the high index glass frit coated onto the roughened surface at step (b) is generally comprised between 15 and 100 $g/m^2$, preferably between 20 and 90 $g/m^2$, more preferably between 25 and 80 $g/m^2$, and most preferably between 30 and 70 $g/m^2$.

At the end of the firing step the enamel may contain small pores filled with gas trapped inside the solidified coating.

Such pores advantageously act as additional light-scattering elements. The concentration of these pores may be controlled by tuning the frit particle size and the firing conditions and is preferably comprised between 0.1 and 2 vol %, more preferably between 0.5 and 1.8 vol. %.

The glass frit used in the present invention and the enamel resulting therefrom preferably are substantially devoid of solid scattering particles such as crystalline $SiO_2$ or $TiO_2$ particles. Such particles are commonly used as scattering elements in high index scattering layers but generally require an additional planarization layer, thereby increasing the total thickness of the high index coating. In the present invention, the shallow roughness profile together with the absence of solid scattering elements allow for very thin high index glass coatings.

The lapped and planarized glass substrates resulting from step (c) are particularly useful as substrates for bottom-emitting OLEDs. A transparent conductive layer has to be applied on top of the high index enamel before application of the stack of organic light emitting layers.

In a preferred embodiment, the method of the present invention therefore further comprises an additional step (step (d)) of coating the high index enamel resulting from step (c) with a transparent conductive layer, preferably a transparent conductive oxide.

Transparent conductive layers that may be used as anodes for OLEDs are well known in the prior art. The most commonly material used is ITO (Indium Tin Oxide). The transparent conductive layer should have a light transmission of at least 80%, and a refractive index of between 1.7 and 2.2. Its total thickness is typically comprised between 50 and 200 nm.

To the Applicant's best knowledge a transparent OLED substrate, obtainable by the method of the present invention, comprising a flat translucent glass substrate having on one side or on both sides a roughness profile such as described above, and a high index enamel having a refractive index of at least 1.7, preferably of between 1.7 and 2.2, completely covering the roughness profile of the roughened surface, and optionally a transparent conductive layer coated onto the high index enamel, has not yet been described in the prior art and therefore is also a subject-matter of the present invention.

This of course also applies to an organic light emitting diode comprising such a transparent OLED substrate, preferably at its anode side.

EXAMPLE

Eighteen glass plates (200 mm×200 mm, float glass) having a thickness of 0.7 mm were submitted to lapping on a lapping equipment, allowing for one face lapping and simultaneous double face lapping.

Four different abrasion slurries from G&P Technology Company were used having particle sizes of 500 mesh, 1000 mesh, 2000 mesh and 3000 mesh respectively. The finest abrasion slurries (2000 mesh and 3000 mesh) were used for one-side and for double-side lapping. Each lapping was made in triplicate, i.e. on three glass plates.

At the end of the lapping step, the samples were cleaned by ultra-sonication in order to eliminate particles still adhering to the abraded surface.

The abraded surfaces were then submitted to 3D laser microscopy (Keyence VK-X100 microscope, laser spot size of 0.26 μm×0.26 μm, λs=0.8 μm, λc=0.25 mm) for determination of the roughness profile and parameters. Three large area analyses (270 μm×202 μm) were carried out on each sample and the average values were calculated from nine raw data series (three analyses on each of the triplicates).

The below table shows the arithmetical mean deviation (Ra), the maximum height of profile (Rz) and the mean width of the profile elements (RSm) of the assessed profiles. Comparative data for a sample obtained by HF etching (SATINOVO®) are also provided.

The results of below Table 1 show that, for a given satisfactory haze range of about 88-94% (one-face lapped samples), the profiles resulting from step (a) of the method of the present invention have significantly lower roughness parameters (Ra) than a prior art glass substrate roughened by HF-etching (SATINOVO®). The maximum height of profile (Rz) for Example 1 obtained with the coarsest abrasion slurry (#500 abrasive) is similar to the prior art SATINOVO® sample, but for all Examples obtained with finer abrasion slurries, the Rz values are significantly lower than for SATINOVO®.

TABLE 1

| Example | Roughening method | Ra (μm) | Rz (μM) | RSm (μM) | Haze % |
|---|---|---|---|---|---|
| 1 | One face lapping with #500 abrasive | 1.52 | 17.8 | N/A | 93.1 |
| 2 | One face lapping with #1000 abrasive | 0.65 | 8.9 | 45.3 | 90.6 |
| 3 | One face lapping with #2000 abrasive | 0.34 | 4.5 | 36.0 | 88.8 |
| 4 | Two face lapping with #2000 abrasive | 0.34 | 4.5 | 36.0 | 96.1 |
| 5 | One face lapping with #3000 abrasive | 0.31 | 4.4 | 34.6 | 88.4 |
| 6 | Two face lapping with #3000 abrasive | 0.31 | 4.4 | 34.6 | 94.7 |
| Comparative (SATINOVO ®) | One face etching with HF | 2.40 | 16.9 | N/A | 88.0 |

The minimum amount of high index glass frit for satisfactorily planarizing the substrates of Examples 1, 2, 3, and 5 amounted to 90 g/m$^2$, 65 g/m$^2$, 60 g/m$^2$ and 55 g/m$^2$ respectively, whereas the SATINOVO® sample required about 110 g/m$^2$.

The above results show that the method of the present invention provides a rather simple, low-cost and efficient means for preparing thin light-scattering glass substrates suitable for manufacturing of OLEDs with internal and external light extraction layers.

The invention claimed is:

1. A method of producing a transparent diffusive organic light emitting diode substrate comprising:
   (a) lapping one face or both faces of a flat translucent glass substrate with an abrasive slurry, so as to obtain a flat glass substrate with at least one roughened surface having a roughness profile with an arithmetical mean deviation Ra of between 0.1 μm and 0.8 μm, said at least one roughened surface being roughened only by said lapping;
   (b) coating the at least one roughened surface with a high index glass frit having a refractive index of at least 1.7 to form a coated substrate, the amount of the high index glass frit being sufficient to completely cover the roughness profile of the at least one roughened surface after melting of said high index glass frit;
   (c) heating the coated substrate to a temperature above the melting temperature of the high index glass frit and below the softening temperature of the glass substrate, so as to form high index enamel on the at least one roughened surface, wherein the amount of the high index glass frit coated onto the at least one roughened surface at step (b) is comprised between 25 and 80 g/m², and wherein the high index glass frit and the resulting enamel are substantially devoid of solid scattering particles.

2. The method according to claim 1, wherein the abrasive slurry of step (a) contains abrasive particles having a Knoop hardness of at least 1800 HK.

3. The method according to claim 2, wherein the abrasive particles are selected from the group consisting of aluminium oxide, silicon carbide (SiC), zirconium oxide doped with Mg, Y or Ce, boron nitride, mixtures of these particles and composite core-shell particles.

4. The method according to claim 3, wherein the abrasive particles are white corundum or green SiC particles.

5. The method according to claim 2, wherein the abrasive particles have a mean particle size comprised in the range from 500 to 5000 mesh.

6. The method according to claim 5, wherein the mean particle size is comprised in the range from 800 to 3500 mesh.

7. The method according to claim 6, wherein the mean particle size is comprised in the range from 1000 to 3200 mesh.

8. The method according to claim 7, wherein the mean particle size is comprised in the range from 2000 to 3000 mesh.

9. The method according to claim 2, wherein the Knoop hardness is at least 2000 HK.

10. The method according to claim 1, wherein the lapping step (a) is carried out simultaneously on both faces of the flat glass substrate.

11. The method according to claim 1, wherein the lapping pressure at step (a) is comprised between 1.38 kPa and 6.89 kPa.

12. The method according to claim 1, wherein the lapping time at step (a) is comprised between 3 and 60 minutes.

13. The method according to claim 12, wherein the lapping time is comprised between 5 and 30 minutes.

14. The method according to claim 13, wherein the lapping time is comprised between 10 and 20 minutes.

15. The method according to claim 1, wherein a haze of the flat glass substrate with one or two roughened surfaces resulting from step (a) is comprised between 85 and 97%.

16. The method according to claim 15, wherein the haze of the flat glass substrate is comprised between 87 and 96%.

17. The method according to claim 1, wherein the amount of the high index glass frit coated onto the at least one roughened surface at step (b) is comprised between 15 and 100 g/m².

18. The method according to claim 1, wherein the flat translucent glass substrate entering step (a) has a thickness of between 0.1 and 5 mm.

19. The method according to claim 18, wherein the flat translucent glass substrate entering step (a) has a thickness of between 0.3 and 1.6 mm.

20. The method according to claim 1, further comprising coating the high index enamel resulting from step (c) with a transparent conductive layer.

21. The method according to claim 20, wherein the transparent conductive layer is made of transparent conductive oxide.

22. The method according to claim 1 wherein the high index glass frit has the following composition:
$Bi_2O_3$: 55-75 wt %;
BaO: 0-20 wt %;
ZnO: 0-20 wt %;
$Al_2O_3$: 1-7 wt %;
$SiO_2$: 5-15 wt %;
$B_2O_3$: 5-20 wt %;
$Na_2O$: 0.1-1 wt %;
$CeO_2$: 0-0.1 wt %.

23. The method according to claim 1, wherein the arithmetical mean deviation Ra is between 0.15 µm and 0.8 µm.

24. The method according to claim 23, wherein the arithmetical mean deviation Ra is between 0.2 µm and 0.8 µm.

25. The method according to claim 24, wherein the arithmetical mean deviation Ra is between 0.25 µm and 0.8 µm.

26. The method according to claim 1, wherein the amount of the high index glass frit coated onto the at least one roughened surface at step (b) is comprised between 30 and 70 g/m².

27. The method according to claim 1, wherein the arithmetical mean deviation Ra is between 0.1 µm and 0.65 µm.

* * * * *